US007136307B2

(12) United States Patent
Piersimoni et al.

(10) Patent No.: US 7,136,307 B2
(45) Date of Patent: Nov. 14, 2006

(54) WRITE STATE MACHINE ARCHITECTURE FOR FLASH MEMORY INTERNAL INSTRUCTIONS

(75) Inventors: Pietro Piersimoni, Avezzano (IT); Pasquale Pistilli, Capelle dei Marsi (IT)

(73) Assignee: Micron Technology, Inc., Boise, ID (US)

(*) Notice: Subject to any disclaimer, the term of this patent is extended or adjusted under 35 U.S.C. 154(b) by 8 days.

(21) Appl. No.: 11/123,184

(22) Filed: May 6, 2005

(65) Prior Publication Data
US 2005/0195655 A1 Sep. 8, 2005

Related U.S. Application Data

(63) Continuation of application No. 10/910,361, filed on Aug. 4, 2004, now Pat. No. 7,027,331, which is a continuation of application No. 10/457,381, filed on Jun. 10, 2003, now Pat. No. 6,879,522, which is a continuation of application No. 09/803,047, filed on Mar. 12, 2001, now Pat. No. 6,618,291.

(51) Int. Cl.
*G11C 11/34* (2006.01)
(52) U.S. Cl. ............................ 365/185.29; 365/185.18; 365/185.33

(58) Field of Classification Search .......... 365/185.29, 365/185.11, 185.3, 185.22, 185.33, 185.24, 365/185.18
See application file for complete search history.

(56) References Cited

U.S. PATENT DOCUMENTS

| 4,718,037 A | 1/1988 | Thaden |
| 5,355,464 A * | 10/1994 | Fandrich et al. ............. 365/218 |
| 5,553,231 A * | 9/1996 | Papenberg et al. ............. 714/5 |
| 5,621,687 A | 4/1997 | Doller |
| 5,805,501 A | 9/1998 | Shiau et al. |
| 5,937,424 A | 8/1999 | Leak et al. |
| 5,940,861 A | 8/1999 | Brown et al. |
| 6,026,016 A | 2/2000 | Gafken |
| 6,081,870 A | 6/2000 | Roohparvar |
| 6,115,292 A | 9/2000 | Fukuda et al. |
| 6,201,739 B1 | 3/2001 | Brown et al. |
| 6,374,337 B1 | 4/2002 | Estakhri |
| 2005/0276129 A1 * | 12/2005 | Meihong et al. ............. 365/200 |

* cited by examiner

*Primary Examiner*—Tuan T Nguyen
*Assistant Examiner*—Hien Nguyen
(74) *Attorney, Agent, or Firm*—Dickstein Shapiro LLP (57) ABSTRACT

A system and method for a write state machine for non-volatile memory is disclosed. The write state machine has an associated read only memory for storing instructions for operation of the non-volatile memory.

1 Claim, 6 Drawing Sheets

WRITE STATE MACHINE ARCHITECTURE FOR FLASH MEMORY INTERNAL INSTRUCTIONS

This application is a divisional of application Ser. No. 10/910,361, filed Aug. 4, 2004, which is a divisional of application Ser. No. 10/457,381, filed Jun. 10, 2003, which is a continuation of application Ser. No. 09/803,047, filed Mar. 12, 2001, now U.S. Pat. No. 6,618,291, all of which are incorporated by reference herein.

BACKGROUND OF THE INVENTION

I. Field of the Invention

The present invention relates to the field of nonvolatile memory devices. In particular, the present invention relates to an improved write state machine for flash memory devices.

II. Description of the Related Art

One type of nonvolatile memory is flash electrically erasable programmable read only memory (flash EEPROM, or "flash memory"). Similar to electrically erasable programmable read only memory (EEPROM), flash memory may be erased electrically without being removed from the computer system. Flash memory is also similar to erasable programmable read only memory (EPROM) because flash memory is arranged in blocks such that the entire contents of each block must be erased at once.

Flash memories differ from conventional electrically erasable programmable read only memory ("EEPROMs") with respect to erasure. Conventional EEPROMs typically use a select transistor for individual byte erase control. Flash memories, on the other hand, typically achieve much higher density with single transistor cells. During one prior art flash memory erase method, a high voltage is supplied to the sources of every memory cell in a memory array simultaneously. This results in a full array erasure.

Conventionally for flash EEPROM, a logical "one" means that few if any electrons are stored on a floating gate associated with a bit cell. A logical "zero" means that many electrons are stored on the floating gate associated with the bit cell. Erasure of this type of flash memory causes a logical one to be stored in each bit cell. Each single bit cell of this type of flash memory cannot be overwritten individually from a logical zero to a logical one without an erasure of an entire block of memory cells. Each single bit cell of that flash memory can, however, be overwritten from a logical one to a logical zero, given that this entails simply adding electrons to a floating gate that contains the intrinsic number of electrons associated with the erased state. The process of adding electrons to the floating gate associated with a bit cell is referred to as programming.

The erasure process of a flash memory array typically involves several steps typically including precondition and postcondition steps. First, the transistors of the block to be erased are preconditioned, whereby the threshold voltages of the memory transistors are increased. The preconditioned transistors are then erased and verified. Certain transistors may have been over-erased, and hence may have negative threshold voltages. These transistors are postconditioned to bring their threshold voltages back up to a certain minimum level. The programming process is similarly comprised of various steps. Flash memory cells are programmed and verified to ensure that programming was successful.

Flash memory has a limited threshold for the number of programming and erasure cycles which each flash memory device can withstand before device degradation or failure. Typically this threshold is about a 100,000 programming and erasure cycles. This cycle lifetime can be further extended to 1,000,000 cycles when flash memory devices incorporate wear-leveling algorithms that distribute data amongst flash memory blocks.

Conventional flash memory devices that do not contain logic to control program and erase sequences burden the system microprocessor with the task of sequencing the flash memory through its program and erase steps. More recent flash memory devices incorporate write state machines which help alleviate the heavy burden on the microprocessor. Upon receipt of a command from the microprocessor, the write state machine cycles the flash memory array through its many erase or program steps automatically, and then reports back to the microprocessor when it is finished.

In previous flash memory devices incorporating a write state machine, the microprocessor could not read from or write to the flash memory device while the erase and program sequences were being performed. The erase and program sequences can take up a significant amount of time, especially in the event of an unsuccessful erase or program step that must be repeated. This presents a problem when a microprocessor desires access to the flash memory array while the write state machine has control of the device.

This problem was alleviated by incorporating an erase suspend function within the write state machine. The microprocessor asserts an "erase suspend" command on the data bus, causing the write state machine to pause its erase sequence. The microprocessor may then read from a block in the flash memory array which is not being accessed by the write state machine. The interrupted erase sequence is then resumed once the microprocessor has finished with the read cycle.

Other advanced functions are carried out by the write state machine. In conventional flash memory devices these functions are laid out in an instruction circuit which contains the necessary logic to perform the instructions in the flash memory array. There exists a need for a more flexible and efficient system for storing these instructions.

SUMMARY OF THE INVENTION

The present invention relates to a system and method for a write state machine for flash memory. The system and method provide for a write state machine for efficiently carrying out the steps needed to program and erase a Flash memory. The instructions are stored in read only memory (ROM) contained within the write state machine. The write state machine further includes an address counter, to select the next instruction to be executed from the ROM, counters to cycle addresses in the flash memory array, and control logic to execute the current instruction.

With the use of the internal ROM, the write state machine can be manufactured ahead in the design cycle, regardless of the final form of the instructions for the flash memory. Further, the same write state machine can be re-used in different flash memory chips, requiring only the re-programming of the internal ROM with the necessary instructions.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

Figures 1, 1A:
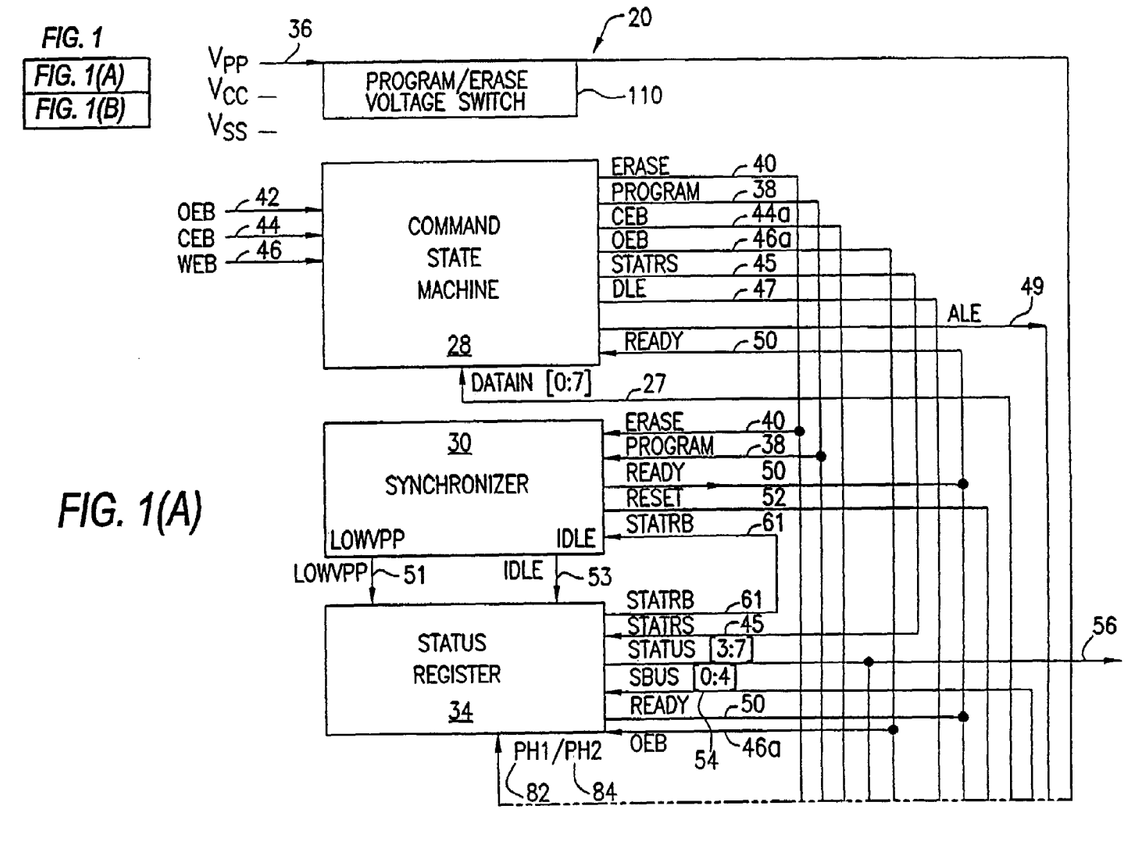
FIG. 1 is shows the relationship of FIGS. 1A and 1B.
FIGS. 1A and 1B are a block diagram of circuitry of a flash memory device, including a write state machine.
Figure 1B:
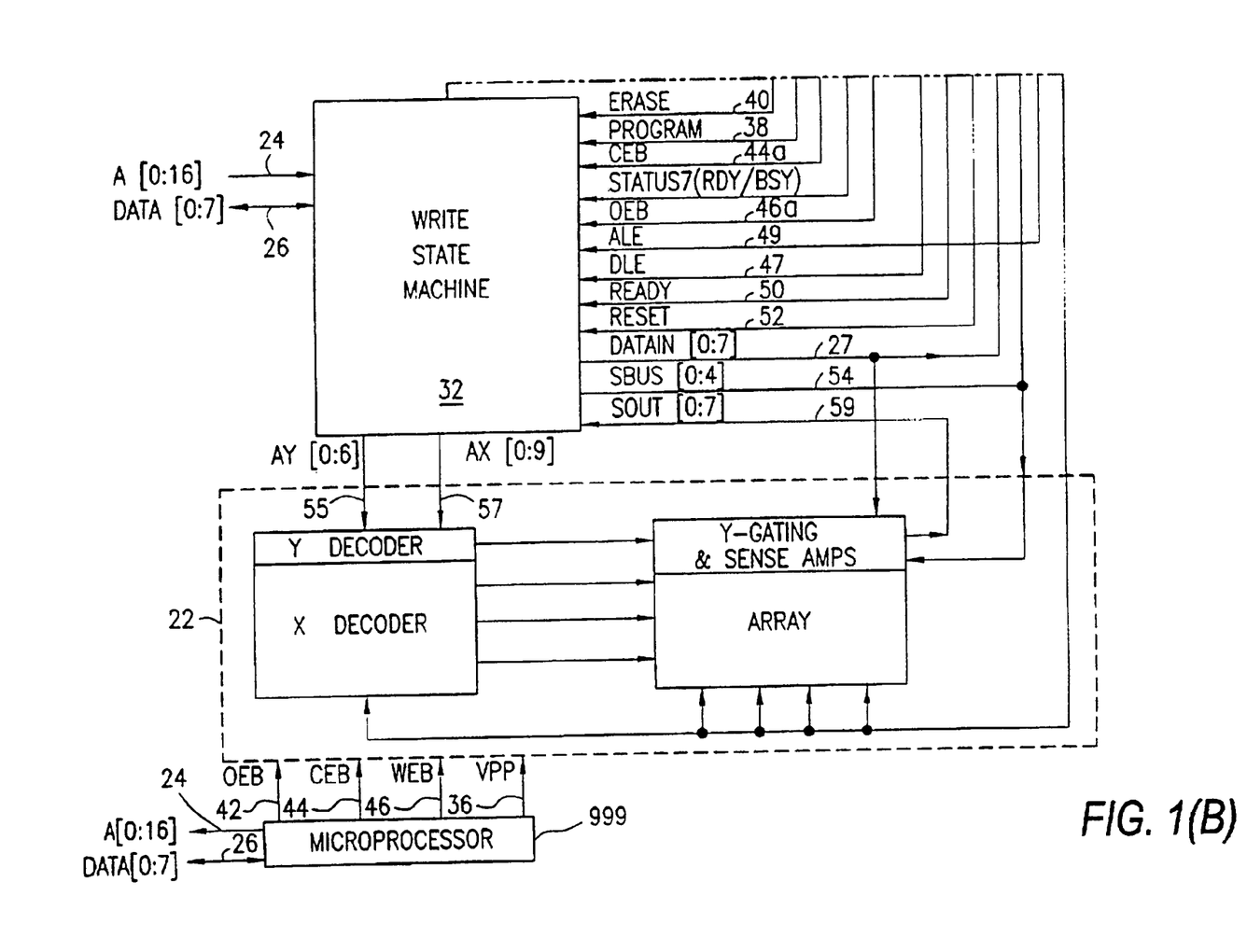

Understanding a conventional write state machine used in flash memory devices is necessary to fully comprehend the present invention, as the present invention improves upon the conventional system. FIGS. 1A and 1B illustrate a conventional flash memory device 20 containing a write state machine 32. The write state machine 32 sequences the non-volatile semiconductor memory 20 through multi-step sequences (instructions) to program or erase memory contents as desired with only an initiating command from microprocessor 999. Once a program or erase instruction is initiated, write state machine 32 controls programming and erasure. Status register 34 indicates to the microprocessor 999 when program and erase operations have been completed through STATUS outputs 56 which are multiplexed by write state machine 32 on data lines 26.

Vpp 36 is the erase/program power supply voltage for the flash memory. Vcc is the device power supply for flash memory 20 and Vss is ground. Vpp 36 is typically 12.0 volts and Vcc is approximately 5 volts.

When the program/erase voltage switch 110 is in a position to prohibit passage of Vccp 36, flash memory 20 acts as a read-only memory. The data stored at an address supplied via lines 24 is read from flash memory array 22 and made available via data input/output lines 26 to the circuitry, e.g., the microprocessor 999, external to the flash memory 20.

Flash memory 20 has three control signals: chip-enable (CEB) 44, write enable (WEB) 46, and output-enable (OEB) 42. The CEB 44 input is the power control and is used to select flash memory 20. CEB 44 is active low. The OEB 42 input is the output control for flash memory 20 and is used to gate data from the output pins from flash memory 20. OEB 42 is active low. Both control signals CEB 44 and OEB 42 must be logically active to obtain data on the data lines 26 of flash memory 20.

WEB 46 allows writes to command state machine 28 while CEB 44 is low. When WEB 46 is active low, addresses and data are latched on the rising edge of WEB 46. Standard microprocessor timings are used.

Flash memory 20 includes a flash memory array 22, which includes memory cells that store data at addresses. The flash memory array 22 includes a read path, a write path and verification circuitry, which are not illustrated. In addition, flash memory 20 includes on-chip command state machine (CSM) 28 and synchronizer 30, in addition to the memory array 22, write state machine (WSM) 32 and status register 34.

Commands to program or erase memory array 22 are applied via data lines 26. The data on data lines 26 is passed onto DATAIN[0:7] 27, via the write state machine 32, and received by command state machine 28. The command state machine 28 decodes the data and if it represents an erase, program or status register reset command, the CSM 28 begins generating the appropriate commands in the form of control signals. The commands provided by the command state machine 28 to the write state machine 32 include PROGRAM 38, ERASE 40, status register reset signal STATRS 45, address latch enable ALE 49, and data latch enable signal DLE 47.

The program and erase instructions are regulated by the write state machine 32, including program or erase pulse repetition where required and internal verification of data, as will be discussed in detail herein below.

Write state machine 32 latches the necessary address and data needed to perform erase and program instructions from inputs A[0:16] 24 and D[0:7] 26. The operation of the write state machine's address and data latches is controlled respectively by address latch enable signal ALE 49 and data latch enable signal DLE 47 from the CSM 28.

The write state machine 32 interfaces with memory array 22 via array address signals AY[0:6] 55 and AX[0:9] 57 and sense amp outputs SOUT[0:7] 59, which represent the data stored at the addressed memory location. When it is active, the write state machine controls the read path, the write path, and the verification circuitry of the memory array 22 via SBUS[0:4] 54.

Write state machine 32 also reports its status during operation to synchronizer 30 and status register 34 via SBUS[0:4] 54.

The synchronizer 30 provides synchronization between the write state machine 32 and the command state machine 28. Upon receipt of either an active ERASE 38 or PROGRAM 40 signal, synchronizer 30 forces the READY signal 50 to a logic low, indicating to the command state machine 28 and the status register 34 that the write state machine 32 is busy. When the write state machine 32 completes its operation, synchronizer 30 shuts down the write state machine 32 by setting READY.

The synchronizer 30 resets the write state machine 32 whenever ERASE 38 and PROGRAM 40 go to a logic low by forcing RESET signal 52 to a logic high. The synchronizer 30 also reports to the status register 34, providing information about the status of write state machine 32 operation via LOWVPP 51.

The status register 34 decodes SBUS[0:4] 54 and indicates to the microprocessor 999 whether an operation is complete or not and its success via STATUS outputs 56. STATUS outputs 56 are multiplexed onto the data lines 26 via write state machine 32.

Figures 2, 2A:
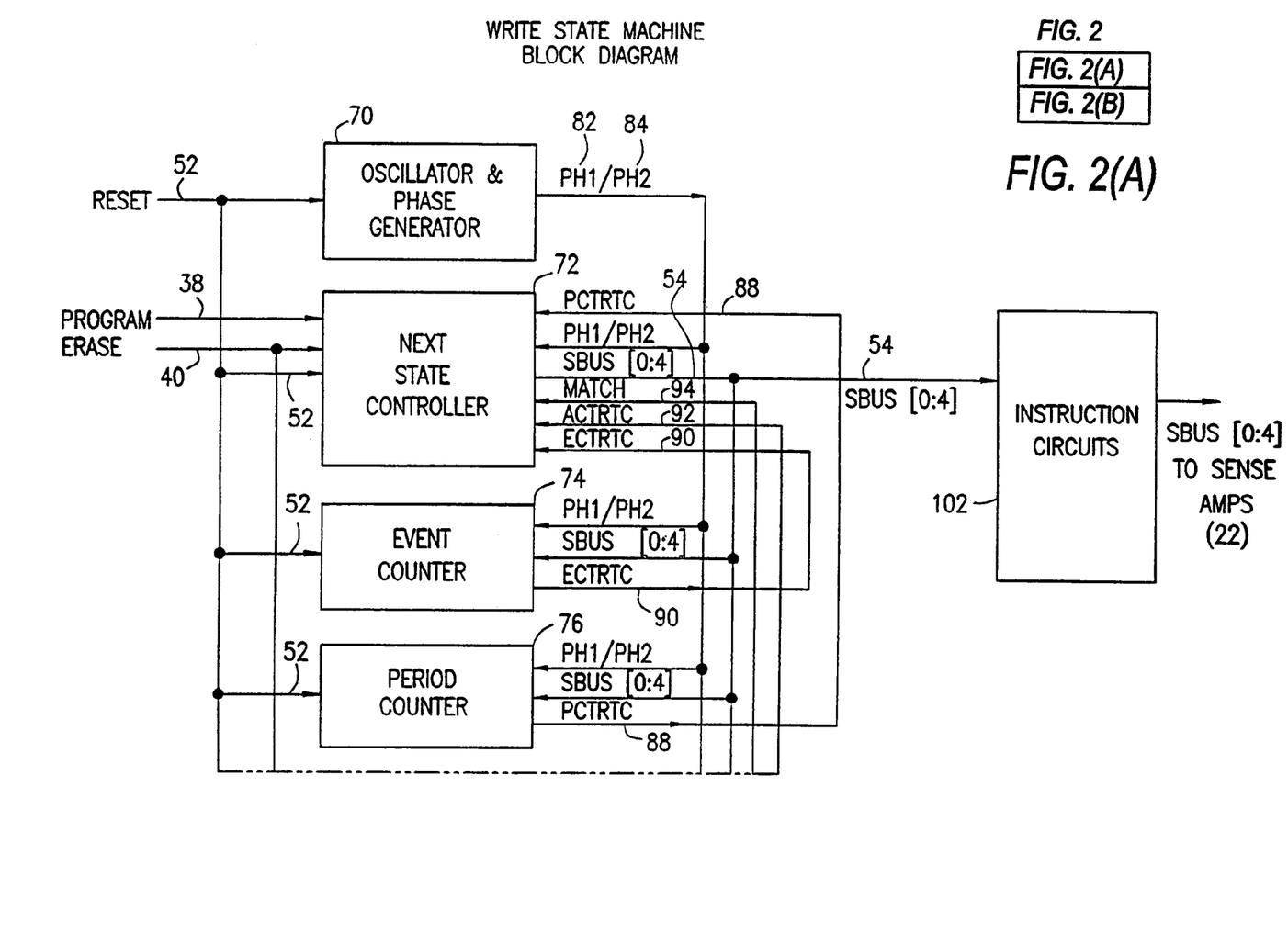
FIG. 2 is shows the relationship of FIGS. 2A and 2B.
FIGS. 2A and 2B are a block diagram of the write state machine of FIG. 1.
Figure 2B:
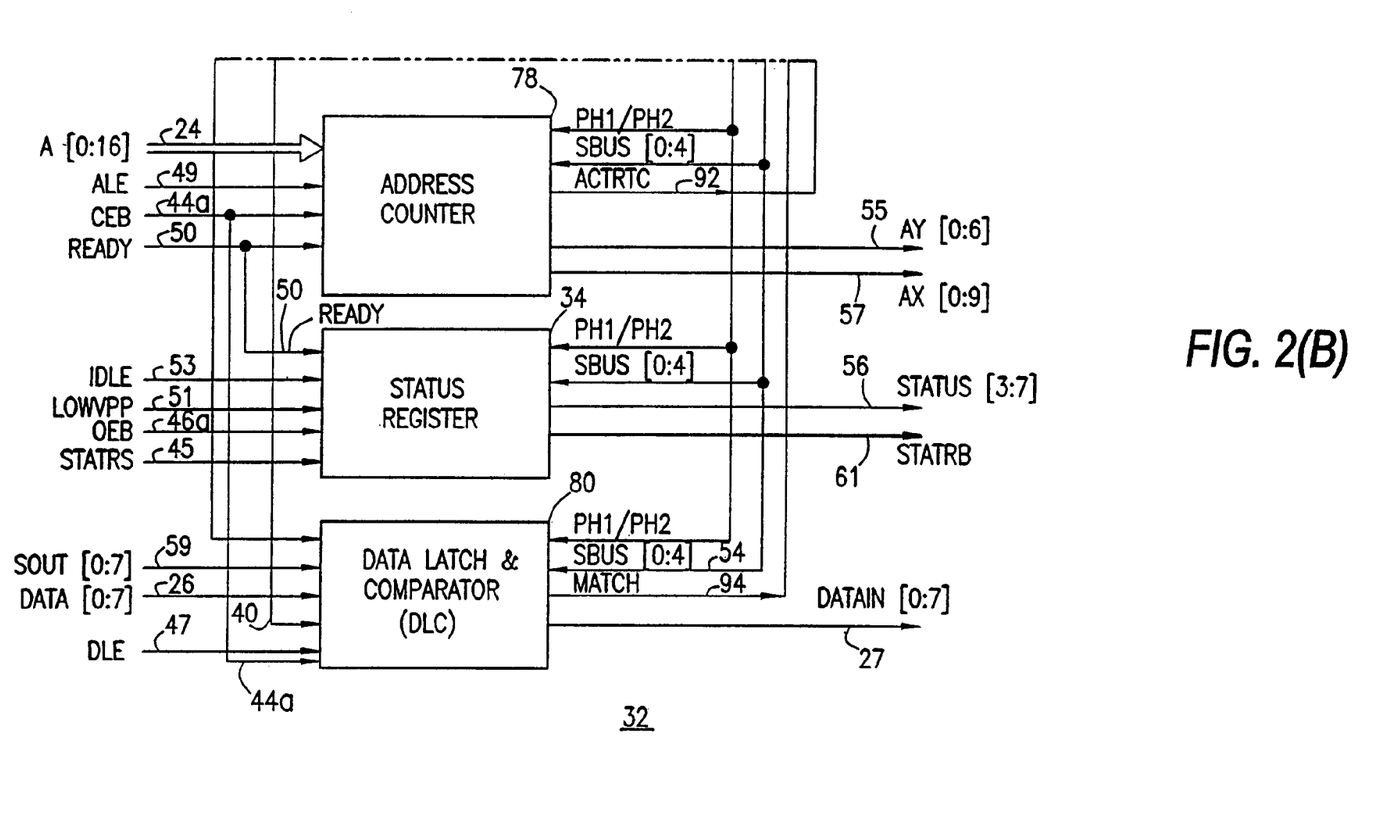

FIGS. 2A and 2B illustrate in block diagram form, the circuitry of write state machine 32 and its connection to the status register 34. The conventional write state machine 32 includes an oscillator and generator 70, a next state controller 72, an event counter 74, a period counter 76, an address counter 78 and a data latch and comparator ("DLC") 80.

The RESET signal on line 52 is applied to all circuits within the write state machine 32, except the address counter 78. The RESET signal on line 52 forces critical nodes within the write state machine 32 to known states. For example, the RESET signal on lines 52 forces count signals on lines PCTRTC 88, ECTRTC 90 and ACTRTC 92 to a logic zero.

Shortly after receiving an inactive RESET signal, the oscillator/phase generator 70 begins generating two non-overlapping phase clocks, phase 1, PH1 82, and phase 2, which are routed to nearly all of the write state machine 32 circuitry. PH2 84 is the first clock active after the RESET signal is applied on line 52.

Next state controller 72 controls and coordinates the activities of the write state machine 32 and determines the write state machine's next state. Next state controller 72 generates the five outputs SBUS[0:4] 54, which indicate the write state machine's current state. Each circuit 102 receiving SBUS[0:4] 54 from the next state controller 72 performs its own SBUS[0:4] 54 decode to determine its next task. This design allows many tasks to be performed in parallel, minimizing the time needed it takes to perform erase and program functions. The circuits 102 receiving SBUS[0:4] 54 are instruction circuits 102 containing hardwired logic for specific instructions for the flash memory array 22, i.e. write, read, etc. for cells in the flash memory array 22.

The period counter 76 determines and times the pulse periods for array voltages during program and erase operations. Another period indicated by period counter 76 is the delay between programming or erasing and verification of valid data from memory cells. By going active-high, the period counter's 76 count signal PCTRTC 88 informs the next state controller 72 that the selected period of time has elapsed.

The period counter 76 decodes SBUS[0:4] 54 to select the desired pulse period. SBUS[0:4] 54 also causes the period counter 76 to reset its count one state before period counter 76 is to be enabled.

The event counter 74 determines when the maximum number of program or erase operations per byte has been reached. When the maximum number of operations per byte has been reached, the event counter 74 informs the next state controller 72 by bringing the event count signal ECTRTC 90 to a logic high. The event counter 74 determines the maximum number of operations by decoding the SBUS[0:4] 54. The maximum number of program pulses per program operation is set, for example to 50, and the maximum number of erase pulses per erase operation is set, for example to 8192.

Within write state machine 32, the address counter 78 functions as both an input buffer and a counter. When READY 50 is high the address at address lines A[0:16] is output as signals AY[0:6] 55 and AX[0:9] 57. Signals AY[0:6]55 and AX[0:9]57 point to the location of the byte in memory array 22 which is to be programmed, erased or read. The address counter 78 then counts through all the addresses in the memory array 20. The address counter 78 indicates to the next state controller 72 that the end of memory has been reached by forcing its address count signal ACTRTC 92 to a logic one.

The data latch and comparator (DLC) 80 is the interface between the WSM 32 and the command state machine 28, memory array 22 and data lines 26. Data input on data lines 26 is buffered by the DLC 80 and passed on to the command state machine 28 as DATAIN[0:7] signals 27.

If DATAIN[0:7] signals 27 represent a program command, the command state machine 28 will direct DLC 80 to store the information at data lines 26 by setting the data latch enable signal DLE 47 to a logic one. During a program operation, the DLC 80 compares the data stored in its latches to sense amp signals SOUT[0:7] 59 and indicates a match by setting MATCH 94 to a logic high.

The DLC 80 compares the sense amp signals, SOUT[0:7] 59, which are indicative of memory cell contents, to a reference logic level during erase verification and indicates successful erasure to next state controller 72 by setting MATCH 94 to a logic high.

The status register 34 reports the status of the write state machine 32 to the microprocessor 999 via STATUS signals 56, which are multiplexed onto data lines 26. The status register 34 determines the write state machine's status based upon the signals READY 50, LOWVPP 51 and SBUS[0:4] 54.

In a conventional flash memory model, as described above with reference to FIGS. 1A, 1B, 2A and 2B the instructions for the flash memory are executed by one or more instruction circuits 102, e.g. logic gate combinations, in response to an internal SBUS[0:4] signal on internal bus SBUS[0:4] 120 from the next state controller 72. The instruction circuits 102 then provide output on SBUS [0:4] 54 to enable or disable sense amplifiers in the memory array 22 to effectuate the desired operation of the instruction. Internal SBUS [0:4] 120 propagates signals within the write machine 32. SBUS[0:4] 54 propagates signals from the output of the instruction circuits 102 (both external to the write state machine 32).

By using instruction circuits 102, the design and manufacture of the flash memory devices can only occur after the instruction set has been determined since the instruction set logic is hardwired. The instruction set is often not determined until the entire system is built, which based upon the application could require a delay of several months. Also the sequence of instructions for the program or erase algorithm is hardwired in the next state controller 72. Changing the program or erase algorithm requires the modification of gates and connections, with overhead in time and cost when production is started.

Figure 3:
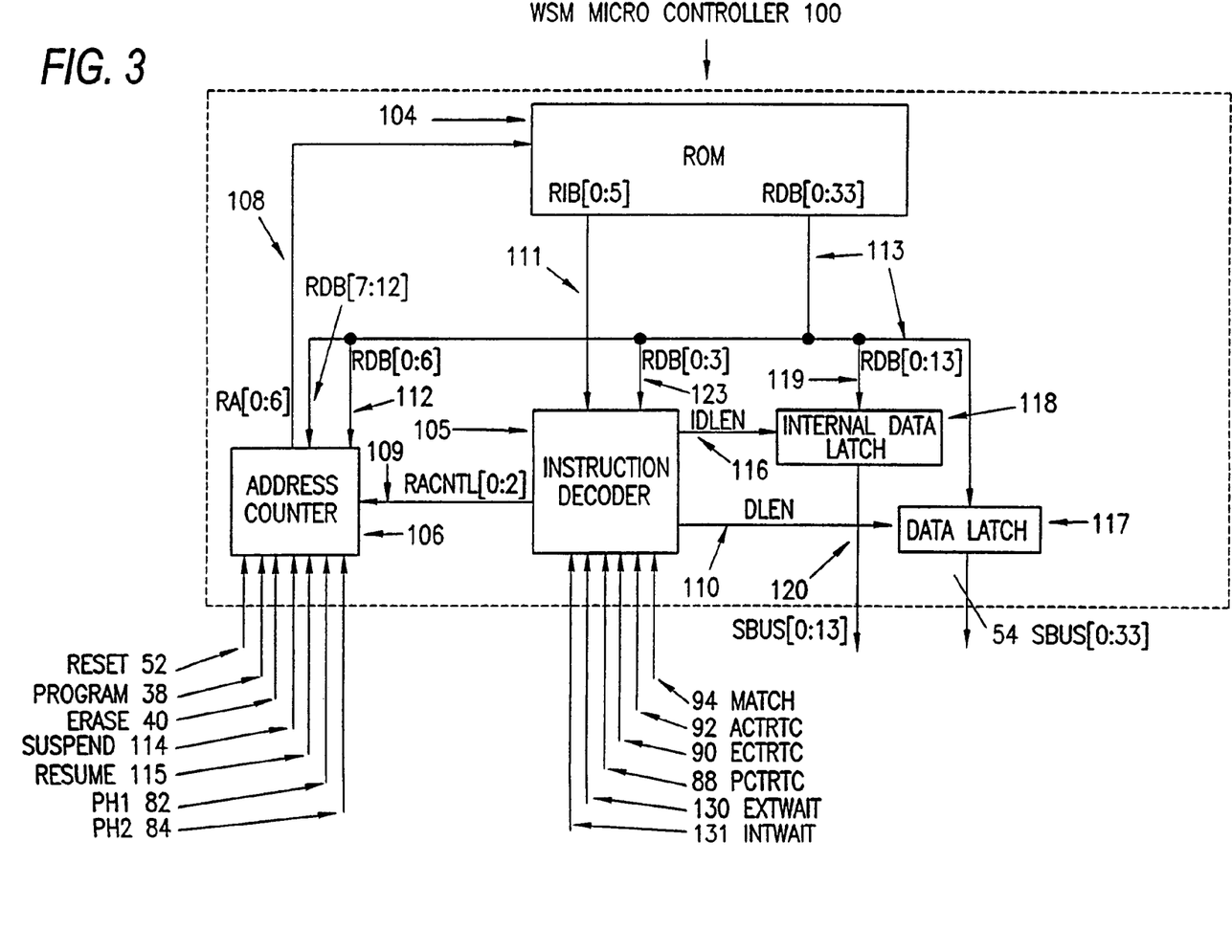
FIG. 3 is a block diagram of an improved write state machine of the present invention.

The present invention replaces the next state controller 72 and instruction circuits 102 of the conventional write state machine 32 of FIGS. 2A and 2B with a circuit called a WSM (write state machine) microcontroller 100 illustrated in FIG. 3, whose advantages over the prior art architecture will become apparent, as its function will be discussed below. Every row of the read only memory (ROM) 104 stores a specific data pattern, that is output on the ROM output lines RIB[0:5] 111 and RDB[0:33] 113 when a specific ROM address is present on the lines RA[0:6] 108. The address counter 106 generates the ROM address 108 in response to controls issued by the instruction decoder 105 through the control lines RACNTL[0:2] 109. PH1 82 and PH2 84 are two non-overlapping clocks; a new address for the ROM is propagated on address lines RA[0:6] 108 at each rising edge of clock PH2 84.

ROM data on fines RIB[0:5] 111 encodes specific settings to control the instruction decoder 105, the address counter 106, the data latch 117 and internal data latch 118.

According to the code on RIB[0:5] 111, the instruction decoder 105 will use the control lines RACNTL[0:2] 109 to select the next consecutive address, a new address, or confirm the current address into the address counter 106 for the next PH2 cycle.

Based on RIB[0:5] 111 the instruction decoder 105 will set IDLEN 116 in order to propagate the RDB[0:13] 119 to the SBUS[0:13] 120 in the present PH2 cycle. In the same way, based on RIB[0:5] 111 the instruction decoder 105 will set DLEN 110 in order to propagate RDB[0:33] 113 to the SBUS[0:33] 54 in the present PH2 cycle.

Depending on the instruction encoded in RIB[0:5] 111, instruction decoder 105 may also disable IDLEN and/or DLEN so that the current RDB[0:13] 119 and RDB[0:33] 113 are not propagated to the SBUS[0:13] 120 and SBUS [0:33] 54. In this latter case the SBUS signals are kept at the existing values using the internal data latch 118 and data latch 117.

For another code of RIB[0:5] 111 the instruction decoder 105 will load the address counter 106 with the value of RDB[0:6] 112, and this value will be the address output on lines RA[0:6] 108 in the next PH2 cycle.

The patterns stored at each ROM line can be logically grouped to generate specific sequences of the signals SBUS

[0:13] 120 and SBUS[0:33] 54. Further signals are used to make the generic sequences act as the Flash operational algorithms:

RESET 52 initializes the address counter 106 to a known state after chip initialization;

PROGRAM 38 when asserted forces the first address after the rising edge of PH2 84 to point to the first instruction of the program algorithm;

ERASE 40 when asserted forces the first address after the rising edge of PH2 84 to point to the first instruction of the erase algorithm SUSPEND 114 when asserted forces the first address after the rising edge of PH2 84 to point to the first instruction of the sequence that will suspend the program or erase algorithm in progress;

RESUME 115 when asserted forces the first address after the rising edge of PH2 84 to point to the first instruction that will resume the suspended operation, being it a program or an erase;

In addition, by using the bits on lines RDB[0:4] 123, the pattern in the ROM can force the instruction decoder 105 to use the value of external signals to set the value of control signals RACNTL[0:2] 109, IDLEN 116 and DLEN 110. The signals used in the Flash program and erase algorithms are:

MATCH 94 when set will inform the instruction decoder 105 that the current data read out from the Flash memory match a specific pattern, and therefore the instruction decoder 105 will select the next address in the program or erase sequence based on this information;

ACTRTC 92 when set will inform the instruction decoder 105 that the current address to the Flash memory has reached a specific maximum, and therefore the instruction decoder 105 will select the next address in the program or erase sequence based on this information;

ECTRTC 90 when set will inform the instruction decoder 105 that the event counter of program pulses or erase pulses has reached a specific maximum, and therefore the instruction decoder 105 will select the next address in the program or erase sequence based on this information;

PCTRTC 88 when set will inform the instruction decoder 105 that the counter of time duration of the erase pulse or program pulse has reached a specific maximum and that therefore a given time has elapsed, and therefore the instruction decoder 105 will select the next address in the program or erase sequence based on this information.

The WSM microcontroller 100 has all the features needed to implement the Flash erase or program algorithms. An example of instruction set is listed here: the different instructions can be encoded in RIB[0:5] 111 values, while the instruction arguments can be set in the RDB[0:33] 113 bus:

RIB[0:5]=SET RDB[0:33] 113 is latched by DLEN 110 into data latch 117.

RIB[0:5]=SETEW RDB[0:13] 119 is passed onto SBUS[0:13] 120 and a subset of RDB[0:33] 121 is latched into data latch 117. Instruction decoder 105 is configured to confirm the present address RA[0:6] 108 until an active high level is detected on EXTWAIT 130. This feature can be used to synchronize the machine with an external event.

RIB[0:5]=SETIW RDB[0:13] 119 is passed onto SBUS[0:13] 120 and a subset of RDB[0:33] 113 is latched into data latch 117. Instruction decoder 105 is configured to set address counter 106 to Confirm the present address RA[0:6] 108 until an active high level is Detected on INTWAIT 131. This feature presents an additional port to synchronize the machine with an event.

RIB[0:5]=JMP_IF TRUE According to RDB[0:3] 123, instruction decoder 105 verifies the high value of MATCH 94 or ACTRTC 92 or ECTRTC 90 or PCTRTC 88 to set address counter 109, IDLEN 116 and DLEN 110. RDB[0:6] 112 is used to provide a direct jump address to the address counter 106.

RIB[0:5]=JMP_IF FALSE According to RDB[0:3] 123, instruction decoder 105 verifies the low value of MATCH 94 or ACTRTC 92 or ECTRTC 90 or PCTRTC 88 to set address counter 109, IDLEN 116 and DLEN 110. RDB[0:6] 112 is used to provide a direct jump address to the address counter 106.

RIB[0:5]=JMP RDB[0:6] 112 provide a direct unconditioned jump address inside address counter 106.

RIB[0:5]=CALL RDB[0:6] 112 provide a direct unconditioned jump address inside address counter 106. RDB[7:12] 132 is used to store inside address counter 106 an additional address, used by the next RETURN instruction.

RIB[0:5]=RET Restores into address counter 106 the previously stored address by a CALL instruction. Execution starts in the ROM at this address. RDB[0:33] bits are available as generic data to be set by DLEN 110.

The present invention's architecture presents several advantages over the prior art architecture illustrated in FIGS. 1A, 1B, 2A and 2B. First, instructions needed to perform a given algorithm are stored as micro instructions in the ROM 104 and therefore the sequences can be easily changed by reprogramming only the ROM 104. This allows for development of the code of the ROM late in the design phase and also for easy adjustments when flash memory production ramps up. Given an instruction set more sequences can be placed in ROM 104 simply enlarging it, without any modification of the instruction decoder 105, internal data latch 118 and data latch 117, and simply adding additional address lines RA[0:6] 108 to address counter 106 and ROM 104. This architecture lends itself to the sequencing of more complex algorithms, not only erase or program algorithms, especially in the area of test procedures. For example a routine that exhaustively programs the whole Flash array to all 0's and read them back can be easily implemented with WSM microcontroller 100 and the existing instruction set. The same bit position of the ROM can represent a different function in different patterns. In fact RDB[0:6] 112, RDB[0:3] 123, RDB[0:13]119, RDB[7:12] 132 and RDB[0:33] 113 share some or all their bits positions, but the bit function is properly differentiated with the selective control of RACNTL[0:2] 109, IDLEN 116, DLEN 110 by the instruction decoder 105 in response to a code of RIB[0:5] 111. This technique allows for savings in the numbers of ROM columns. Further, the same WSM microcontroller 100 can be used in different Flash memory devices, only requiring the reprogramming of ROM 104 and connections of the signals RESET 52, PROGRAM 38, ERASE 40, SUSPEND 114, RESUME 115, PH1 82, PH2 84, MATCH 94, ACTRTC 92, ECTRTC 90, PCTRTC 88, SBUS[0:4] 120 and SBUS[0:4] 54 in the new circuit configuration.

Figure 4:
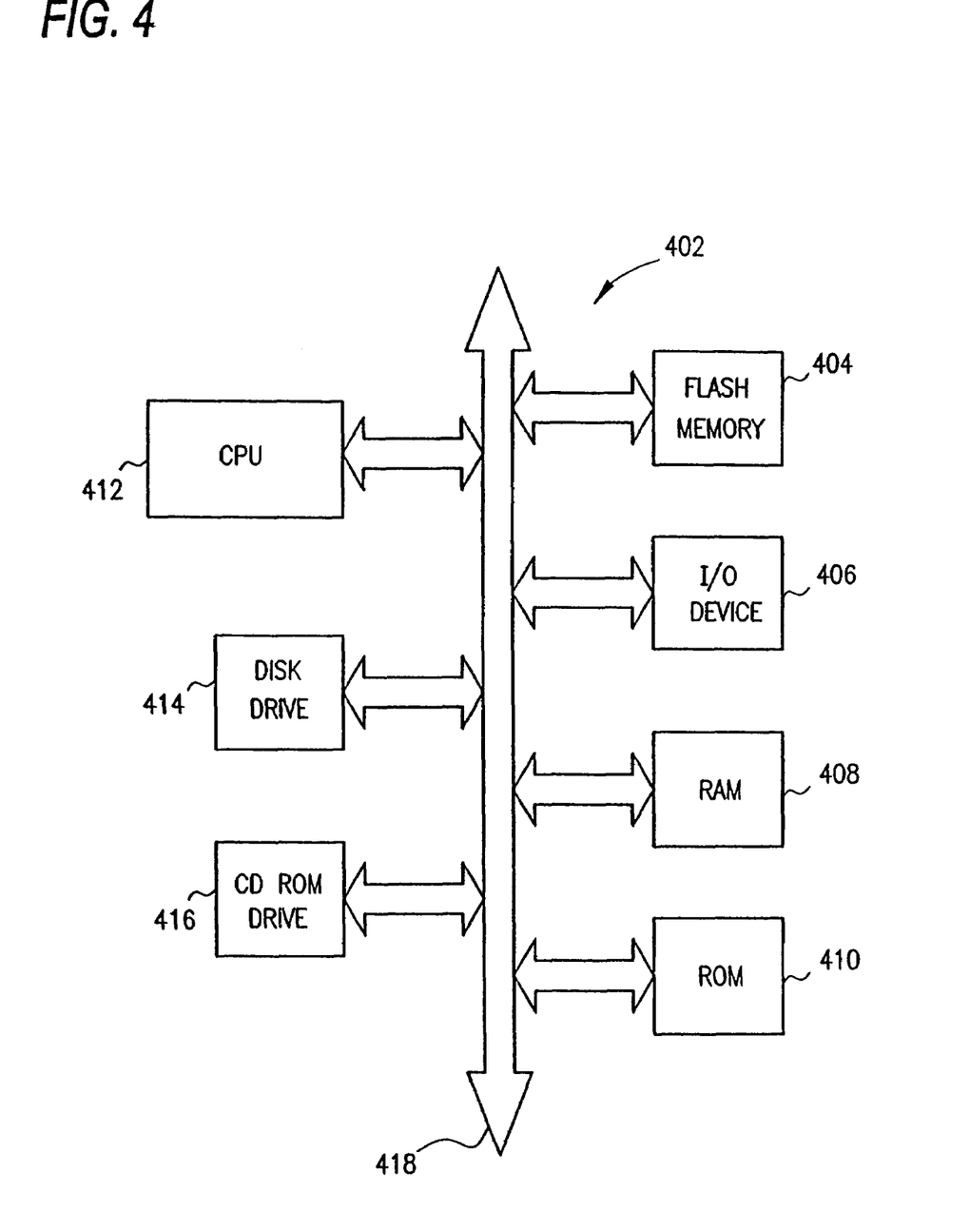
FIG. 4 illustrates a processor system employing a flash memory device containing the improved write state machine of FIG. 3.

FIG. 4 illustrates a simplified processor system 400 which includes a central processing unit (CPU) 412, flash memory device 404, RAM and ROM memory devices 408, 410, input/output (I/O) device 406, disk drive 414 and CD ROM drive 416. Flash memory device 404 may contain the FIG. 3 WSM microcontroller 100 and associated ROM 104 for the instructions for the operations of the flash memory array in accordance with the present invention.

It is to be understood that the above description is intended to be illustrative and not restrictive. Many variations to the above-described system and method will be readily apparent to those having ordinary skill in the art. For example, the ROM 104 need not reside within the microcontroller 100 and write state machine 32 but may reside external to the microcontroller 100 and write state machine 32, yet integrated on the same chip.

Accordingly, the present invention is not to be considered as limited by the specifics of the particular system and method which have been described and illustrated, but is only limited by the scope of the appended claims.

What is claimed as new and desired to be protected by Letters Patent of the United States is:

1. A process for forming a flash memory integrated circuit comprising:

storing a plurality of state machine instructions in a read only memory circuit, said read-only memory circuit being disposed on a semiconductor substrate;

forming a state machine circuit on said semiconductor substrate, said state machine circuit being adapted to receive said plurality of state machine instructions and responsively control a memory device disposed on said substrate including preconditioning a transistor of said memory device to increase a threshold voltage of said transistor, erasing said transistor of said memory device, verifying a function of said transistor of said memory device, and post-conditioning said transistor of said memory device to bring a threshold voltage thereof to a particular level.

* * * * *

UNITED STATES PATENT AND TRADEMARK OFFICE
CERTIFICATE OF CORRECTION

PATENT NO.       : 7,136,307 B2
APPLICATION NO.  : 11/123184
DATED            : November 14, 2006
INVENTOR(S)      : Pietro Piersimoni et al.

It is certified that error appears in the above-identified patent and that said Letters Patent is hereby corrected as shown below:

Title Page
    In (63) Related U.S. Application Data, the following errors are corrected:

"Continuation of application No 10/910,361" should read --Divisional of application No. 10/910,361--; and

"continuation of application No. 10/457,381" should read --divisional of application No. 10/457,381--.

In the Specification, the following error is corrected:

Column 6, line 41, "fines" should read --lines--.

Signed and Sealed this

Sixth Day of February, 2007

JON W. DUDAS
*Director of the United States Patent and Trademark Office*